(12) United States Patent
Guering et al.

(10) Patent No.: US 10,893,624 B2
(45) Date of Patent: Jan. 12, 2021

(54) ASSEMBLY COMPRISING A MODULE COMPRISING ELECTRONIC EQUIPMENT ITEMS, AND AN ASSOCIATED SUPPORTING STRUCTURE

(71) Applicant: Airbus Operations (S.A.S.), Toulouse (FR)

(72) Inventors: Bernard Guering, Montrabe (FR); Romain Delahaye, Colomiers (FR)

(73) Assignee: Airbus Operations (S.A.S.), Toulouse (FR)

( * ) Notice: Subject to any disclaimer, the term of this patent is extended or adjusted under 35 U.S.C. 154(b) by 0 days.

(21) Appl. No.: 16/173,855

(22) Filed: Oct. 29, 2018

(65) Prior Publication Data
US 2019/0132980 A1 May 2, 2019

(30) Foreign Application Priority Data
Oct. 31, 2017 (FR) .................................. 17 60299

(51) Int. Cl.
*H05K 7/14* (2006.01)
*H05K 7/20* (2006.01)
*B64D 43/00* (2006.01)

(52) U.S. Cl.
CPC ........... *H05K 7/1412* (2013.01); *B64D 43/00* (2013.01); *H05K 7/20145* (2013.01)

(58) Field of Classification Search
CPC .............. G06F 13/409; G06F 1/183; G06F 2200/1635; H05K 7/1449; H05K 7/1412; H05K 7/1439; H05K 7/1497; H05K 5/02; H05K 7/02; H05K 7/1487; H05K 7/1489; H05K 5/0021; H05K 5/0247; H05K 7/1448; H05K 7/1457; H05K 7/1488; H05K 7/1492; H05K 7/18; B64D 2013/0614; B64D 2221/00; B64D 35/08
See application file for complete search history.

(56) References Cited

U.S. PATENT DOCUMENTS

| | | | | |
|---|---|---|---|---|
| 4,121,276 A | * | 10/1978 | Kovatch | H02B 1/21 174/71 B |
| 4,739,441 A | * | 4/1988 | Galletly | H02B 1/21 174/68.2 |
| 4,836,789 A | * | 6/1989 | Rudy, Jr. | H05K 7/1418 211/41.1 |
| 5,515,236 A | * | 5/1996 | Nolan | H02B 1/21 174/68.2 |

(Continued)

FOREIGN PATENT DOCUMENTS

| | | |
|---|---|---|
| FR | 2958829 A1 | 10/2011 |
| FR | 3000030 | 6/2014 |

OTHER PUBLICATIONS

French Search Report for French Application 1760299 dated Jun. 26, 2018.

*Primary Examiner* — Binh B Tran
*Assistant Examiner* — Michael A Matey
(74) *Attorney, Agent, or Firm* — Jenkins, Wilson, Taylor & Hunt, P.A.

(57) ABSTRACT

A supporting structure of optimized volume includes at least two vertical structural elements having a front face and a rear face. Modules including electronic equipment items are fixed onto the front face of the vertical structural elements. Use in particular can be for the integration of avionics modules on aircraft.

12 Claims, 3 Drawing Sheets

(56) References Cited

U.S. PATENT DOCUMENTS

| | | | | |
|---|---|---|---|---|
| 6,169,658 | B1* | 1/2001 | Arena | F28F 3/02 |
| | | | | 165/104.33 |
| 6,525,937 | B2* | 2/2003 | Yanagida | G06F 1/18 |
| | | | | 165/80.3 |
| 8,550,260 | B1 | 10/2013 | Vircks | |
| 8,760,873 | B2 | 6/2014 | Salles | |
| 9,351,412 | B2 | 5/2016 | Durand et al. | |
| 2006/0082264 | A1* | 4/2006 | Packard, III | H02B 1/21 |
| | | | | 312/223.1 |
| 2006/0082970 | A1* | 4/2006 | Walz | H05K 7/20645 |
| | | | | 361/699 |
| 2007/0139868 | A1* | 6/2007 | Azemard | H05K 7/1449 |
| | | | | 361/637 |
| 2009/0230265 | A1* | 9/2009 | Newman | F24S 25/33 |
| | | | | 248/229.11 |
| 2011/0194269 | A1* | 8/2011 | Colongo | H05K 7/1448 |
| | | | | 361/807 |
| 2011/0198445 | A1* | 8/2011 | Colongo | H05K 7/1449 |
| | | | | 244/131 |
| 2013/0148324 | A1* | 6/2013 | Szolyga | F16M 13/02 |
| | | | | 361/809 |
| 2013/0305517 | A1* | 11/2013 | Vincent | G06F 1/181 |
| | | | | 29/525.11 |
| 2014/0268554 | A1* | 9/2014 | Dunwoody | G06F 1/20 |
| | | | | 361/679.54 |
| 2015/0084491 | A1* | 3/2015 | Guering | H05K 7/20572 |
| | | | | 312/236 |
| 2016/0267042 | A1* | 9/2016 | Dantin | G06F 13/409 |
| 2016/0315453 | A1* | 10/2016 | Taylor | H02B 1/052 |
| 2018/0350277 | A1* | 12/2018 | Entwistle | F16M 13/022 |
| 2019/0157981 | A1* | 5/2019 | Steinberger | H02M 7/003 |
| 2020/0169214 | A1* | 5/2020 | Koch | H02S 20/23 |

\* cited by examiner

ASSEMBLY COMPRISING A MODULE COMPRISING ELECTRONIC EQUIPMENT ITEMS, AND AN ASSOCIATED SUPPORTING STRUCTURE

CROSS-REFERENCE TO RELATED APPLICATION

This application claims the benefit of and priority to French Patent Application number 17 60299 filed on Oct. 31, 2017, the entire disclosure of which is incorporated by reference herein.

TECHNICAL FIELD

The present disclosure relates to an assembly comprising a module comprising electronic equipment items, and an associated supporting structure. The disclosure herein is particularly applicable, in a nonlimiting manner, to the integration of avionics modules on aircraft.

BACKGROUND

In an aircraft, electronic equipment items are grouped together in electronic units or modules and arranged on a supporting structure such as a cabinet.

Generally, these supporting structures or cabinets, accommodating the electronic modules, are situated in the bottom part of the aircraft, between the cockpit and the wings.

In the avionics field, these electronic units, also known as computers, often conform to the ARINC 600 standard or are of IMA "Integrated Modular Avionics" type, and are arranged on cabinets dedicated to receiving them according to specific standards.

A dedicated cabinet housing units is known from the document FR 3 000 030.

These cabinets dedicated to accommodating the electronic equipment items are voluminous.

SUMMARY

An aim of the present disclosure is to optimize the volume occupied by the assembly formed by modules comprising electronic equipment items, and the supporting structure on which the modules are arranged, by proposing a less voluminous assembly comprising a module comprising electronic equipment items, and an associated supporting structure.

To this end, the present disclosure relates, according to a first aspect, to an assembly comprising a module comprising electronic equipment items, and an associated supporting structure.

According to the disclosure herein, the supporting structure comprises at least two vertical structural elements having a front face and a rear face, the module comprising fixing device(s) designed or configured to fix the module onto the front face of the at least two vertical structural elements.

Thus, with the module being fixed onto the front face of the vertical structural elements, the vertical structural elements are situated behind the module, and do not enclose the module over its lateral faces. Consequently, the supporting structure is more compact and occupies a lesser volume than the cabinets used in the prior art.

Furthermore, with the module being fixed onto the vertical structural elements, shelves supporting them are not necessary in the supporting structure, which makes the supporting structure more lightweight.

According to other possible features, taken alone or in combination with one another:
- the fixing device(s) pass through the module between a front face and a rear face of the module, and are designed or configured to be fixed onto the front face of the vertical structural elements;
- the module also comprises a receiver designed or configured to house the fixing device(s), the receiver comprising a cavity extending longitudinally between the front face and the rear face of the module;
- the supporting structure comprises at least one plate comprising an electrical interface, the at least one plate being placed between the at least two vertical structural elements at the front face of the vertical structural elements, the electrical interface in the at least one plate being designed or configured to receive an electrical interface of the module, and comprising an electrical link for linking the electrical interface of the supporting structure to an electrical wiring system;
- the assembly comprises a ventilation system comprising air blowing ducts and air extraction ducts, a vertical structural element comprising an air blowing duct and an air extraction duct;
- the module comprises an air blowing duct and an air extraction duct of the ventilation system;
- the vertical structural element comprises an air inlet and an air outlet, the air extraction duct of a module being linked to the air outlet of a first vertical structural element and the air blowing duct of the module being linked to the air inlet of a second vertical structural element;
- the module also comprises a box section situated under the electronic equipment items, the blowing and extraction ducts being situated inside the box section;
- the fixing device(s) pass through the box section between the front and rear faces of the module;
- the module comprises reinforcing elements situated along the lateral faces of the module;
- the reinforcing elements are two longitudinal elements arranged between the front face and the rear face of the module, on a plane extending over the lateral faces of the module;
- the supporting structure comprises at least two elements for aiding in the mounting of the module, each mounting aid element being fixed onto the front face of each vertical structural element.

The present disclosure relates, according to a second aspect, to an aircraft comprising an assembly according to the disclosure herein.

The aircraft has features and advantages similar to those described previously in relation to the assembly.

Other particular features and advantages of the disclosure herein will become more apparent from the following description.

BRIEF DESCRIPTION OF THE DRAWINGS

In the attached drawings, given as nonlimiting examples.

DETAILED DESCRIPTION

The present disclosure is applicable in the installation of electronic equipment items in an aircraft, in particular units or modules combining electronic equipment items.

More particularly, the disclosure herein is applicable in the installation of modules of IMA ("Integrated Modular Avionics") type.

Obviously, the disclosure herein can be applied to the installation of modules of different type.

Figure 1:
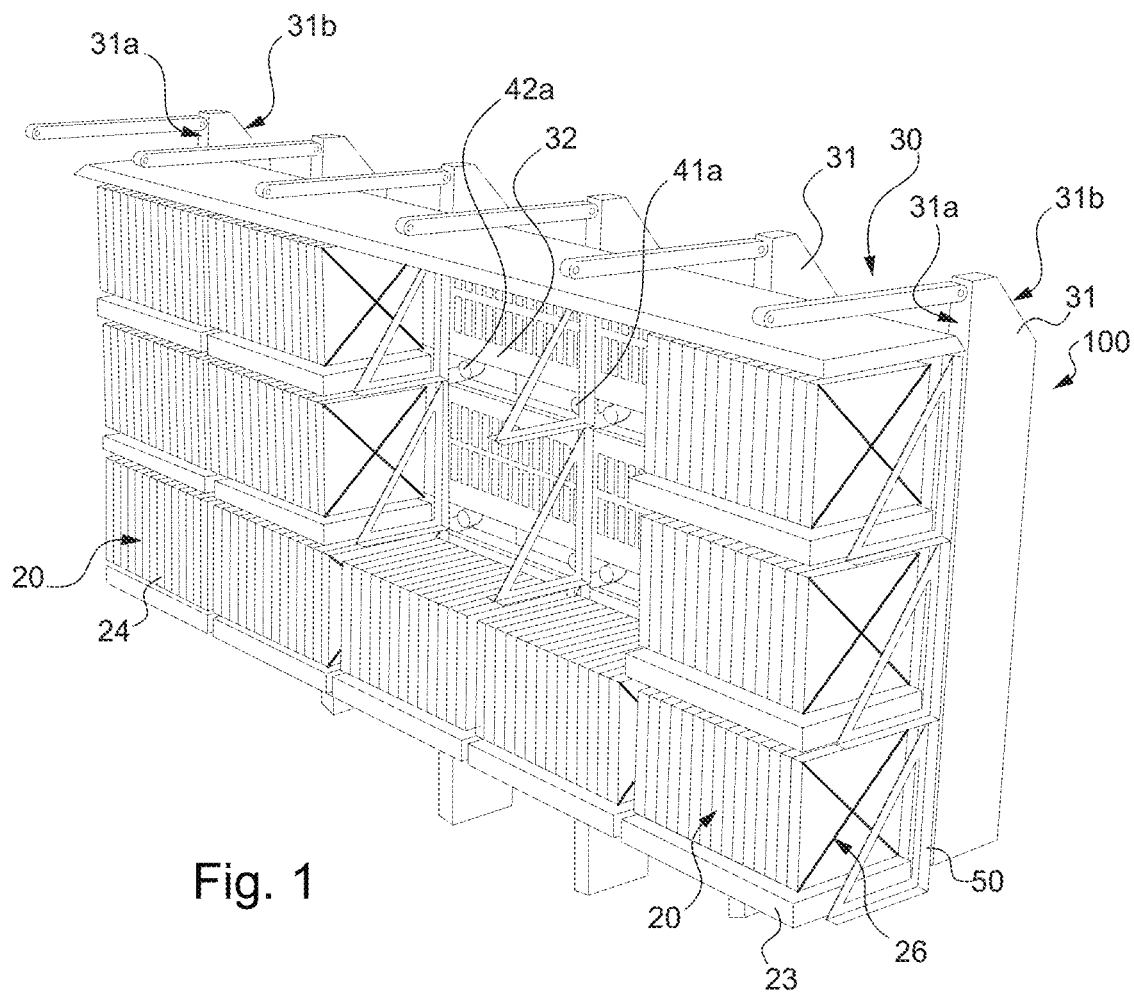
FIG. 1 is a perspective view of an assembly according to an embodiment of the disclosure herein.

FIG. 1 represents a perspective view of an assembly 100 comprising modules 20 comprising electronic equipment items 24, and an associated supporting structure 30.

The supporting structure 30 comprises at least two vertical structural elements 31.

In the supporting structure 30 represented in FIG. 1, the number of vertical structural elements 31 is six.

The supporting structure 30 accommodates a set of modules 20 comprising electronic equipment items 24 (not represented in detail in the figure). In the assembly 100 represented in FIG. 1, eleven modules 20 are installed on the supporting structure 30. It will be noted that the location dedicated to receiving four other modules 20 is represented in order to show in detail the front face of the supporting structure 30.

Obviously, the number of vertical structural elements 31 in the supporting structure 30 and the number of modules 20 accommodated by the supporting structure 30 can be different.

The vertical structural elements 31 take the form of a beam or post and comprise a front face 31a onto which the modules 20 are fixed, and a rear face 31b.

On the rear face 31b, there are a connecting rod 300 (visible in FIG. 2B) and a fitting 301 for securing the supporting structure 30.

In one embodiment, each vertical structural element 31 is linked by a fitting 301 situated in its bottom part, in a reinforced zone dedicated to supporting the supporting structure 30. This reinforced zone is arranged on the fuselage of the aircraft. The supporting structure 30 is linked in its top part by at least one connecting rod 300 linking a vertical structural element 31 to a horizontal platform situated above the supporting structure 30 in a plane at right angles to the plane in which the vertical structural elements 31 extend. This platform or floor can correspond to the floor or surface of the passenger cabin of the aircraft.

The cabinet can be secured with different structure(s) and/or to different parts of the aircraft.

The vertical structural elements 31 are typically produced in aluminum alloy having a thickness of between 2 and 4 mm.

As a nonlimiting example, the length of the vertical structural elements 31 can be between 500 mm and 2500 mm, and has a typical value of 1200 mm. The dimension of the cross section of the vertical structural elements 31 can typically have a value of 60 mm×150 mm.

The material and the dimensions of the vertical structural elements 31 can be different and are not limited to those given here.

In the embodiment described, a module 20 is fixed to two vertical structural elements 31.

For the fixing of the module 20 onto the supporting structure 30, the module 20 comprises fixing device(s) designed or configured to fix it onto the front face 31a of the vertical elements 31. The fixing device(s) will be described later with reference to FIGS. 2A and 2B.

Figure 2A:
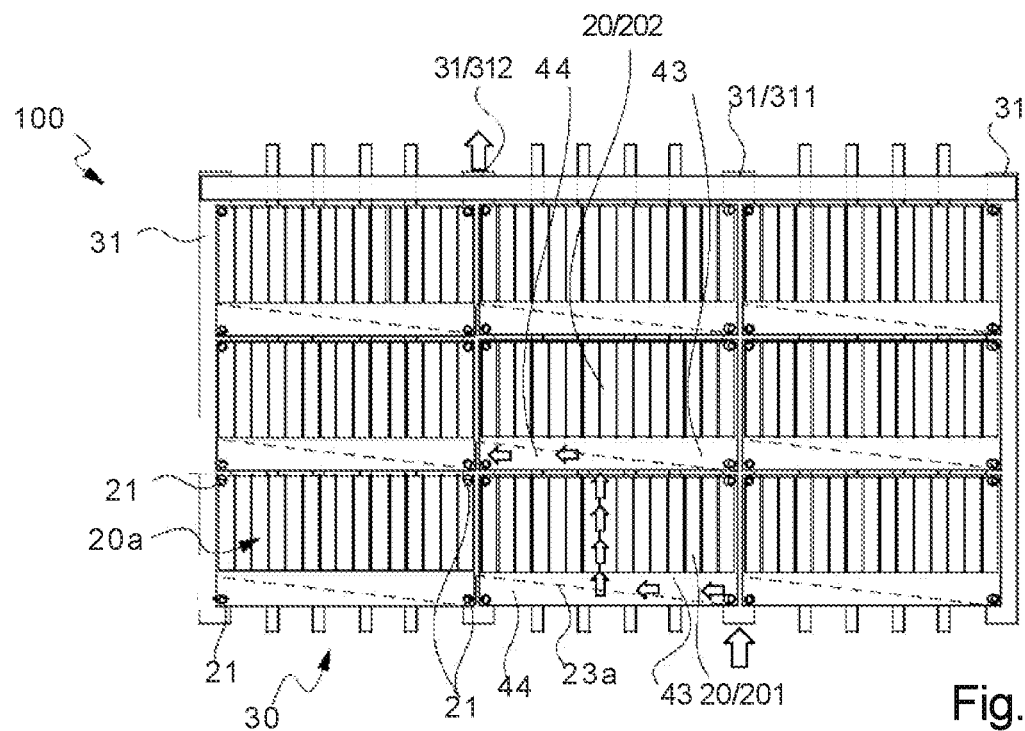
FIG. 2A is a front view of an assembly according to an embodiment of the disclosure herein.
Figure 2B:
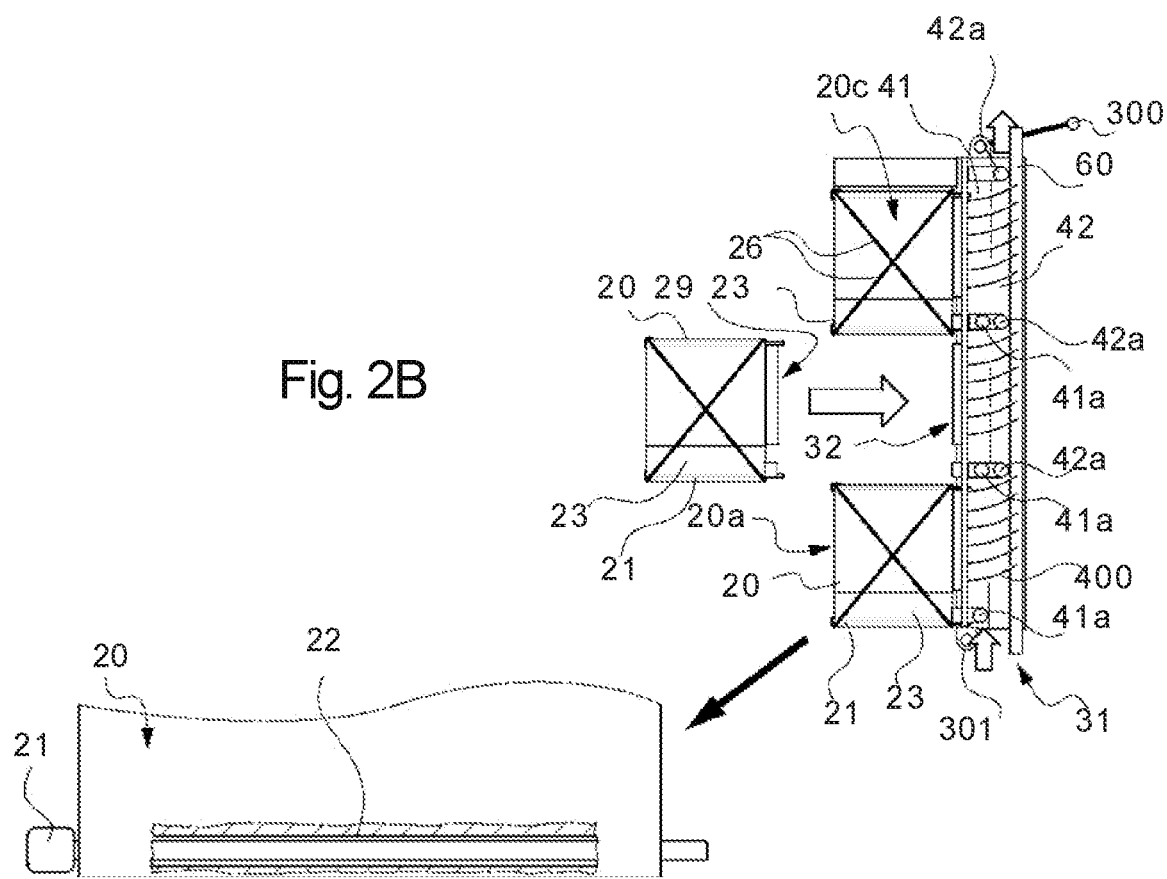
FIG. 2B is a lateral view of the assembly represented in FIG. 2A.

The supporting structure 30 comprises at least one plate 32 comprising an electrical interface designed or configured to receive an electrical interface 29 of the module 20 (visible in FIG. 2B). Each plate 32 is placed between two vertical structural elements 31 on the front face 31a of the vertical structural elements 31.

The electrical interface in the plate 32 of the supporting structure 30 is linked by an electrical link 400 (visible in FIG. 2B) to an electrical wiring system 60 (visible in FIG. 2B), such as the electrical wiring system of an aircraft. Once the module 20 is fixed to the vertical structural elements 31, the electrical interface 29 of the module 20 is linked to the electrical interface in the plate 32 of the supporting structure 30. The electrical interface in the plate 32 of the supporting structure 30 is linked to an electrical wiring system 60, such as the electrical wiring system of an aircraft. The electrical interface 29 of the module 20 is thus linked to the electrical wiring system 60.

In the embodiment represented in FIG. 1, three plates 32 each comprising an electrical interface are arranged between two vertical structural elements 31 at different heights of the vertical structural elements 31.

Obviously, the number of plates 32 placed between two vertical structural elements 31 at different heights can be different.

In the embodiment described, each module 20 is fixed to the supporting structure 30 at each plate 32. Thus, each plate 32 of the supporting structure 30 receives an electrical interface 29 of a module 20. In particular, the electrical interface in each plate 32 receives an electrical interface 29 of a module 20.

FIGS. 2A and 2B respectively represent a front view of an assembly according to an embodiment of the disclosure herein and a side view. The device(s) 20 for fixing the module to the supporting structure 30 are described hereinbelow with reference to FIGS. 2B and 2C.

It will be noted that the supporting structure 30 represented in FIG. 2A comprises four vertical structural elements 31 and three modules 20 are fixed at three different heights between two consecutive vertical structural elements 31.

Thus, nine modules 20 are fixed onto the supporting structure 30 represented in FIG. 2A.

The modules 20 are fixed onto the front face 31a of the vertical structural elements 31 by fixing device(s) 21.

In one embodiment (see FIGS. 2B and 2C), the fixing device(s) 21 are housed by receiver 22 passing through the module 20 between its front face 20a and its rear face 20b.

In one embodiment, the receiver 22 receiving the fixing device(s) 21 is formed by a cavity extending longitudinally between the front face 20a of the module 20 and the rear face 20b.

The receiver is produced for example by boring, in the module 20, a cylindrical cavity with a diameter that is sufficient to allow the passage of the fixing device(s) 21.

In one embodiment, such as that represented in FIG. 2B, the fixing device(s) 21 pass through the module 20 between the front face 20a and the rear face 20b so as to allow an operator to fix the module 20, from the front face of the module 20a, onto the front face 31a of the vertical structural element 31.

In one embodiment, the fixing device(s) 21 are screws of a predefined length, such that they pass through the module 20 between its front 20*a* and rear 20*b* faces.

The diameter of the cylindrical cavity forming the receiver is thus of sufficient value to allow the passage of the stem of the screw.

Figure 2C:
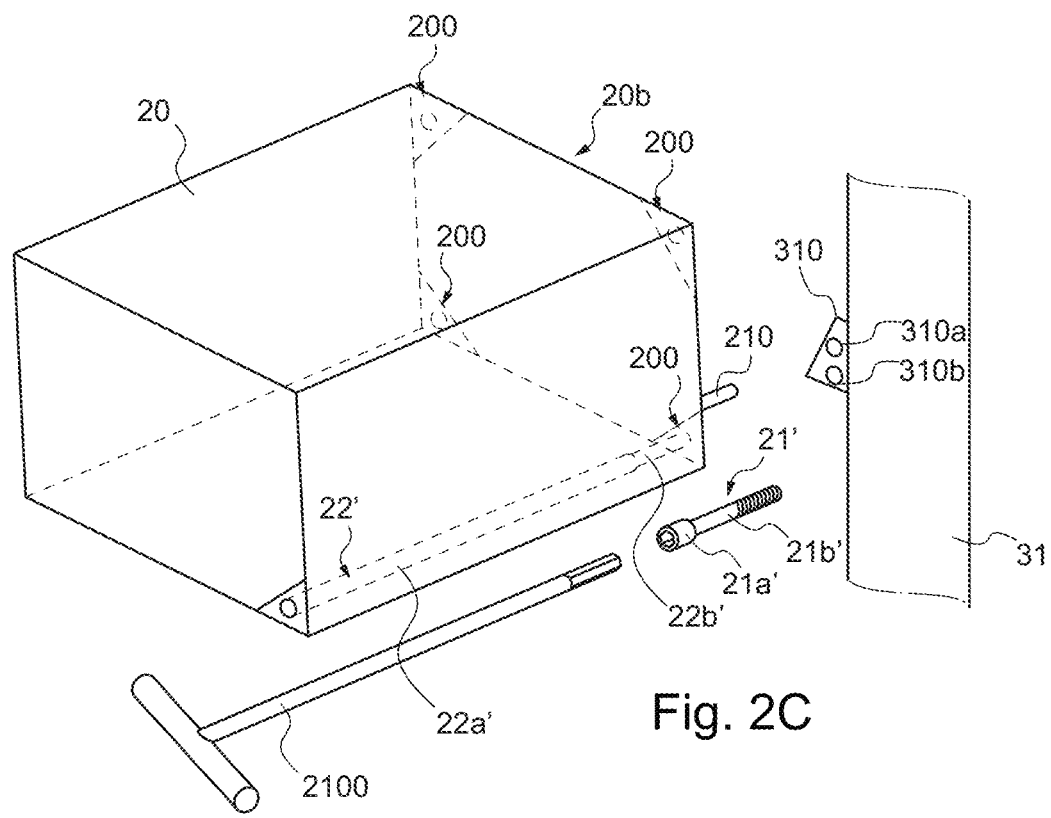
FIG. 2C is a diagram illustrating fixing device(s) according to an embodiment.

In another embodiment such as that represented in FIG. 2C, the fixing device(s) 21' are screws of a length that is less than the depth of the module 20. In this embodiment, the receiver 22' comprises a first cylindrical portion 22*a*' of sufficient diameter to receive the head of the screw 21*a*' forming the fixing device(s) 21' and a second cylindrical portion 22*b*' of sufficient diameter to receive the stem of the screw 21*b*' and to prevent the introduction of the head of the screw 21*a*'.

In this embodiment, a tool 2100 dedicated to the fixing of the screws 21' is necessary for fixing the module 20 to the vertical structural elements 31.

In the embodiment represented in FIG. 2C, the screw has a hexagonal recess.

Obviously, different types of screws can be used, with different recesses, such as triangular, Torx or the like.

The supporting structure 30 comprises complementary fixing device(s) suitable for receiving the fixing device(s) 21 of the module 20 and for cooperating with them for the fixing of the module 20 to the supporting structure 30.

The rear face of the module 20*b* comprises, in this embodiment, reinforced zones 200 situated respectively at the corners of the rear face 20*b* where the receivers 22, 22' respectively emerge. These reinforced zones 200 can of course be applied to the embodiment described with reference to FIG. 2B.

The module 20 also comprises at least one centering post 210 (visible in FIG. 2C, but being similar in the embodiments represented in FIG. 2B).

In one embodiment, a centering post 210 is associated with each reception module 22, 22' receiving the fixing device(s) 21, 21'.

In other embodiments, the module 20 comprises fewer centering posts 210 than fixing device(s) 21, 21'.

The centering posts 210 make it possible to position the module 20, in the mounting thereof, in the correct position such that the fixing device(s) 21, 21' of the module 20 cooperate with the complementary fixing device(s) of the vertical structural elements 31.

In one embodiment, a centering post 210 comprises a protuberance protruding from the rear face of the module 20*b* in a direction at right angles to the plane in which the rear face of the module 21*b* extends and in a direction parallel to a direction in which the receivers 22, 22' extend.

In a nonlimiting manner, the centering posts 210 could have been, for example, bushes or centering pins or any other element assisting in guiding the fixing device(s) 21, 21' in the right direction for the fixing to the vertical structural element 31.

Each vertical structural element 31 comprises fixing zones 310 suitable for receiving the fixing device(s) 21, 21' of the module 20.

These fixing zones 310 are described with reference to FIG. 2C but apply also to the embodiment represented in FIG. 2B.

A fixing zone 310 is provided on each vertical structural element 31 for each fixing device(s) 21, 21'.

In one embodiment, the fixing zone 310 comprises a first drill-hole 310*a* designed or configured to receive the centering pin 210 and a second drill-hole 310*b* designed or configured to receive the stem of the screw 21*b*'.

In this embodiment, the complementary fixing device(s) comprise a floating nut (not visible) fixed at the second drill-hole 310*b*.

Obviously, the fixing device(s) and the complementary fixing device(s) can have other embodiments.

Thus, in these embodiments, the module 20 can be fixed onto the vertical structural elements 31 by introducing the fixing device(s) 21, 21' into the receivers 22, 22', the fixing of the module 20 onto the supporting structure 30 being able to be implemented easily by an operator from the front face 20*a* of the module 20.

It will be noted that the fixing of the module 20 to the supporting structure 30 can be implemented once the supporting structure 30 is installed in a location, without requiring access to the rear part of the supporting structure 30.

Obviously, other fixing device(s) 21, 21' can be employed.

As can be seen in FIGS. 2A and 2C, in the embodiments described, each module 20 comprises four fixing device(s) 21, each fixing device(s) 21 being arranged in receiver 22 placed between the front face 20*a* and the rear face 20*b* of the module 20.

Obviously, the number of fixing device(s) and of receivers can be different, although the number of four allows an optimal fixing of the module 20 onto the supporting structure 30.

In one embodiment, the module 20 also comprises a box section 23 situated under the electronic equipment items 24.

In this embodiment, the fixing of the module 20 onto the vertical element 31 is implemented partly at the box section 23. In particular, the fixing device(s) 21 situated on the bottom part of the module 20 pass through the box section 23 from the front face 20*a* of the module 20 to the rear face 20*b* of the module 20.

The assembly 100 comprises a ventilation system comprising air blowing ducts and air extraction ducts, in order to discharge the heat produced by the electronic equipment items 24.

In one embodiment, each vertical structural element 31 comprises an air blowing duct 41 and an air extraction duct 42 (visible in FIG. 2B).

A vertical structural element 31, comprising both an air blowing duct 41 and an air extraction duct 42, makes it possible to further optimize the space occupied by the supporting structure 30.

The air blowing duct 41 and the air extraction duct 42 are located inside a vertical structural element 31 and extend longitudinally inside the vertical structural element 31.

In one embodiment, the interior of the vertical structural element 31 is divided up so as to form the air blowing duct 41 and the air extraction duct 42.

Likewise, each module 20 comprises an air blowing duct 43 and an air extraction duct 44.

The ventilation system is thus situated as close as possible to the electronic equipment items 24, thus implementing the cooling of the electronic equipment items 24 effectively without adding elements to the supporting structure 30.

It will be noted that, together, the air blowing ducts 41, 43 and the air extraction ducts 42, 44 inside the vertical structural elements 31 and the modules 20 form the ventilation system.

The air extraction 43 and blowing 44 ducts of the ventilation system of the assembly thus comprise a part positioned in the vertical elements 31 and a part positioned in the module 20.

The air blowing 43 and air extraction 44 ducts of the module 20 are situated inside the box section 23. The air blowing 43 and air extraction 44 ducts of the module 20 are visible in FIG. 2A.

The box section 23 makes it possible, in addition to the passage of the air of the ventilation system, to assist in the heightwise securing of the electronic equipment items 24.

In one embodiment, the interior of the box section 23 is divided up into two compartments, each compartment corresponding respectively to the air blowing duct 43 and to the air extraction duct 44.

For example, an insulation element is placed between the compartments in order to thermally insulate them. The insulation element can be an insulating foam.

In another example, a volume of air is confined between the compartments to avoid heat exchanges, such as thermal conduction between them, in particular between a compartment containing cold air and a compartment containing hot air.

In the embodiment described, the box section 23 has a hexahedral form and its interior is divided into two compartments along a diagonal plane 23a.

In the embodiment represented, the air blowing duct 41 in the vertical structural element 31 is situated at the front face 31a of the vertical structural element 31. In other words, the air blowing duct 41 adjoins the rear face 20b of the module 20.

The air blowing duct 41 in the vertical structural element 31, and the air blowing duct 43 in the module 20, are linked to one another.

Similarly, the air extraction ducts 42, 44 in the vertical structural element 31 and in the module 20 are linked to one another.

Each vertical structural element 31 comprises an air outlet 41a designed or configured to be linked to the air blowing duct 43 of a module 20 and an air inlet 42a designed or configured to be linked to the air extraction duct 44 of a module 20.

The air inlets 42a and the air outlets 41a of the vertical structural element 31 are situated in the bottom part of the module 20.

In one embodiment, a cylindrical deformable seal is positioned at linking portions between the air blowing ducts 41, 43, of the vertical structural element 31 and of the module 20, and between the extraction ducts 42, 44 of the vertical structural element 31 and of the module 20. These linking portions are, according to one embodiment, rigid. The deformable seal ensures the seal-tightness of the ventilation system.

In another embodiment, the links between the air blowing duct 43 and the air extraction duct 44 of the module 20 with, respectively, the air blowing duct 41 and the air extraction duct 42 of the vertical structural element 31, are ensured by deformable flexible seals. For example, the module 20 comprises two couplings of flexible tapered sleeve type, one coupling for the air blowing duct 43 and one coupling for the air extract duct 44. The air inlets 42a and the air outlets 41a of the vertical structural element 31 are of flexible cylindrical sleeve type. When the module 20 is fixed onto the supporting structure 30, the couplings in the module 20 are crushed against the complementary couplings in the vertical structural elements 31.

The deformation of the couplings makes it possible to guarantee the seal-tightness of the ventilation system. The deformation of the couplings does not require any clamping collar between the respective couplings.

Figure 3:
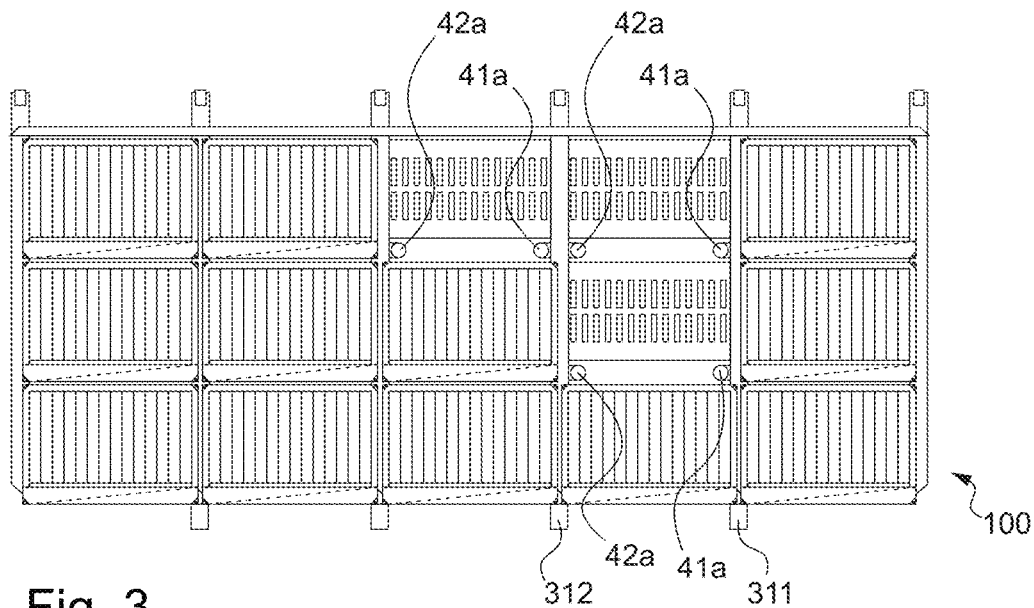
FIG. 3 is a front view of the assembly according to an embodiment of the disclosure herein in which three modules are absent.

The air inlets 42a and the air outlets 41a in the vertical elements 31 can be seen in FIG. 3. It will be noted that the air inlet 42a and the air outlet 41a are situated on either side of each vertical structural element 31. Thus, one and the same module 20 is linked to the air inlet 42a of a first vertical structural element 311, and to the air outlet 41a of a second vertical structural element 312.

Thus, the ventilation system in a vertical structural element 31 is divided between two modules 20 fixed side-by-side onto the supporting structure 30.

The operation of the ventilation system is represented in FIG. 2A. Cold air from the outside of the assembly 100 is introduced into the air blowing duct 41 in a first vertical structural element 31/311. The air circulating through the air blowing duct 41 exits from the first vertical structural element 31/311 through the air outlets 41a to the air blowing ducts 43 in the modules 20.

It will be noted that, in order to clarify FIG. 2A, only the path of the air through a first module 20 is represented. Nevertheless, the path of air is similar for the other modules.

The air circulating through the air blowing duct 43 in the first module 20/201 passes through the electronic equipment items 24 of the module 20/201. The air carries the heat given off by the electronic equipment items 24 to the air extraction duct 44 of a second module 20/202 situated above the first module 20/201.

The air in the air extraction duct 44 of the second module 20/202 is routed through the air inlet 42a to the air extraction duct 42 of a second vertical element 31/312, this air extraction duct 42 taking away the hot air to the outside of the supporting structure 30.

The module 20 also comprises reinforcing elements 26 (represented in FIGS. 2B and 1) situated on the lateral faces 20c of the module 20. It will be noted that only one lateral face 20c is visible in the figures.

The reinforcing elements 26 reinforce the securing of the module 20 on the supporting structure 30, once the module 20 is fixed onto the supporting structure 30. In other words, the reinforcing elements 26 absorb the vertical and shearing forces of the module 20.

In one embodiment, the reinforcing elements 26 are two longitudinal elements, for example of rectangular or tubular form, extending along the lateral faces of the module 20, in a plane at right angles to the plane in which the front face 20a of the module 20 is situated and in a plane in which the rear face 20b of the module 20 is situated.

In this embodiment, the reinforcing elements 26 cross so as to form the diagonals of the lateral faces 20c of the module 20.

In one embodiment, the supporting structure 30 comprises two elements 50 for aiding in the mounting of the modules 20 (see FIG. 1).

The mounting aid elements 50 can be brackets fixed onto the front face 31a of the vertical structural elements 31. Two brackets are mounted respectively on two vertical structural elements 31 at the same height so as to guide a module 20 in the mounting thereof.

It will be noted that a module 20 can be placed on two brackets 50, the brackets 50 supporting the module 20 while a single operator installs the fixing device(s) 21 so as to fix the module 20 onto the supporting structure 30.

The operator can slide the module 20 on the brackets 50 so that the rear face 20b of the module 20 enters into contact with the front face 31a of the vertical support element 31. The operator can then make the mechanical fixing between the module 20 and the supporting structure 30. This mechanical fixing allows for the pneumatic and electronic connection of the module 20 to the supporting structure 30.

By virtue of the brackets 50, a single operator is required for the fixing of the modules 20 onto the supporting structure 30.

The brackets 50 can be dismantled once the module 20 is fixed onto the supporting structure 30 so as to lighten the assembly 100.

While at least one exemplary embodiment of the invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An assembly comprising a module comprising electronic equipment items, and an associated supporting structure, wherein the supporting structure comprises at least two vertical structural elements having a front face and a rear face, the supporting structure comprising at least one plate comprising an electrical interface configured to receive an electrical interface of the module, the module comprising fixing device(s) configured to fix the module onto the front face of the at least two vertical structural elements, wherein the module comprises a receiver configured to house the fixing device(s), the receiver comprising a cavity extending longitudinally between the front face and the rear face of the module, and wherein the at least one plate is disposed between the at least two vertical structural elements at the front face of the vertical structural elements.

2. The assembly according to claim 1, wherein the fixing device(s) pass through the module between a front face and a rear face of the module and are configured to be fixed onto the front face of the vertical structural elements.

3. The assembly according to claim 2, wherein the receiver comprises a cylindrical cavity.

4. The assembly according to claim 1, wherein the electrical interface comprises an electrical link for linking the electrical interface of the supporting structure to an electrical wiring system.

5. The assembly according to claim 1, comprising a ventilation system comprising air blowing ducts and air extraction ducts, a vertical structural element comprising an air blowing duct and an air extraction duct.

6. The assembly according to claim 5, wherein the module comprises an air blowing duct and an air extraction duct of the ventilation system.

7. The assembly according to claim 6, wherein the vertical structural element comprises an air inlet and an air outlet, the air extraction duct of the module being linked to the air outlet of a first vertical structural element and the air blowing duct of the module being linked to the air inlet of a second vertical structural element.

8. The assembly according to claim 6, wherein the module also comprises a box section under the electronic equipment items, the air blowing and air extraction ducts being situated inside the box section.

9. The assembly according to claim 8, wherein the fixing device(s) pass through the box section between the front and rear faces of the module.

10. The assembly according to claim 1, wherein the module comprises reinforcing elements on lateral faces of the module.

11. The assembly according to claim 1, wherein the supporting structure comprises at least two elements for aiding in mounting of the module, each mounting aid element being fixed onto the front face of each vertical structural element.

12. An aircraft comprising at least one assembly, the assembly comprising a module comprising electronic equipment items, and an associated supporting structure, wherein the supporting structure comprises at least two vertical structural elements having a front face and a rear face, the supporting structure comprising at least one plate comprising an electrical interface configured to receive an electrical interface of the module, the module comprising fixing device(s) configured to fix the module onto the front face of the at least two vertical structural elements, wherein the module comprises a receiver configured to house the fixing device(s), the receiver comprising a cavity extending longitudinally between the front face and the rear face of the module, and wherein the at least one plate is placed between the at least two vertical structural elements at the front face of the vertical structural elements.

* * * * *